United States Patent
Filleboeck et al.

(10) Patent No.: US 7,012,478 B2
(45) Date of Patent: Mar. 14, 2006

(54) METHOD AND DEVICE TO CONTROL THE POWER OF MILLIMETER WAVES FOR A V-BAND TR MODULE

(75) Inventors: Marion Filleboeck, Ulm-Soeflingen (DE); Joerg Schroth, Ulm (DE)

(73) Assignee: EADS Deutschland GmbH, Munich (DE)

( * ) Notice: Subject to any disclaimer, the term of this patent is extended or adjusted under 35 U.S.C. 154(b) by 64 days.

(21) Appl. No.: 10/433,464

(22) PCT Filed: Nov. 9, 2001

(86) PCT No.: PCT/DE01/04215

§ 371 (c)(1),
(2), (4) Date: Sep. 23, 2003

(87) PCT Pub. No.: WO02/47245

PCT Pub. Date: Jun. 13, 2002

(65) Prior Publication Data

US 2004/0110476 A1    Jun. 10, 2004

(30) Foreign Application Priority Data

Dec. 4, 2000 (DE) ............................... 100 60 332

(51) Int. Cl.
H01P 1/15 (2006.01)
H01P 1/22 (2006.01)

(52) U.S. Cl. .................................... 333/104; 333/81 A
(58) Field of Classification Search .............. 333/81 A, 333/101, 103, 104, 262
See application file for complete search history.

(56) References Cited

U.S. PATENT DOCUMENTS

| | | | |
|---|---|---|---|
| 4,837,530 A | 6/1989 | Kondoh | 333/81 A |
| 4,843,354 A | 6/1989 | Fuller et al. | 333/81 A |
| 5,103,195 A | 4/1992 | Dunsmore | |
| 5,777,530 A * | 7/1998 | Nakatuka | 333/104 |
| 5,878,331 A | 3/1999 | Yamamoto et al. | 455/83 |
| 5,990,580 A | 11/1999 | Weigand | |
| 6,801,108 B1 * | 10/2004 | Wang et al. | 333/262 |

FOREIGN PATENT DOCUMENTS

DE    196 44 448 A1    7/1997
DE    694 19 995 T2    2/2000

OTHER PUBLICATIONS

Agilent, Agilent AMMC-2008 DC-50 GHz SPDT Switch, Aug. 2003, 7 pages.*

(Continued)

Primary Examiner—Dean Takaoka
(74) Attorney, Agent, or Firm—Crowell & Moring LLP

(57) ABSTRACT

The invention relates to a method to control the power of millimeter waves for a V-band TR module. According to said method, the output power is detected and controlled at a constant level with an electronic control circuit by means of a variable attenuator. The invention proposes that in transmit mode, for operation at a frequency in the 60 GHz range and higher, a first SPDT (single pole double throw) MMIC switch is used as a variable attenuator and a second SPDT MMIC switch which acts as a transmit-receive switch is used as an output power detector. In receive mode, both SPDTs are used as switches. Overall, the power control for the entire TR module results in an increase of the module yield through compensation of chip spread and temperature effects. The multiple use of the SPDT MMICs as switches, variable attenuator and power detector saves costs.

3 Claims, 4 Drawing Sheets

OTHER PUBLICATIONS

G.L. Lan et al., A High Performance V-band Monolithic FET Transmit-Receive Switch, 1988, IEEE, 3 pages.*

T. Shimura et al., High Isolation V-Band SPDT Switch MMIC for High Power Use, 2001, IEEE, 4 pages.*

*IEEE Transactions of Electron Devices,* vol. ED-34, No. 12, Dec. 1, 1987, pp. 2595-2602 entitled DC-40 GHz and 20-40 GHz MMIC SPDT Switches by Manfred J. Schindler.

* cited by examiner

| | | | |
|---|---|---|---|
| 1 | HF INPUT | 5 | DIODE 2 BIAS |
| 2 | HF OUTPUT 2 | 6 | DIODE 3 BIAS |
| 3 | GROUND | 7 | DIODE 4 BIAS |
| 4 | DIODE 1 BIAS | 8 | GROUND |
| | | 9 | HF OUTPUT 1 |

METHOD AND DEVICE TO CONTROL THE POWER OF MILLIMETER WAVES FOR A V-BAND TR MODULE

BACKGROUND AND SUMMARY OF THE INVENTION

The invention relates to a method and a device to control the power of millimeter waves for a V-band TR module and, more particularly, to a method and device to control the power of millimeter waves for a V-band TR module at a frequency in the range of 50 GHz and higher, in which the transmitting and receiving path are separated by means of two SPDT (single pole double throw) MMIC switches.

The output power, particularly in the case of mobile communication units, should be as constant as possible, specifically independently of individual characteristics of the components and units, which are produced in great quantities. At frequencies <50 GHz, variable attenuators are realized on MMICs with PIN diodes or as MESFET switches. Other power control concepts for lower frequencies are also known from the prior art. However, a V-band TR module with a controlled output power is currently not known. A variable attenuator at 60 GHz as an MMIC is also currently not obtainable on the market.

The individual adjustment of the manufactured units is very cost-intensive. It would therefore be desirable to avoid this adjustment by means of a corresponding design. Simultaneously, as few additional components as possible should be required because, on the one hand, these will again scatter individually and, on the other hand, will increase costs.

The firm United Monolithic Semiconductors S.A.S., 91401 Orsay Cedex France, offers a 50–60 GHz SPDT (=Single Pole Double Throw) switch for communication systems with the designation "CHS2190a", which has already been used as a transmit-receive switch in transmitting-receiving modules.

It is an object of the invention to provide power control with the above-mentioned characteristics while using this switch or a corresponding switch.

According to the invention, this object is achieved by a method and device to control the power of millimeter waves for a V-band TR module at a frequency in the range of 50 GHz and higher, in which the transmitting and receiving path are separated by means of two SPDT (single pole double throw) MMIC switches. For the transmission, the first SPDT MMIC switch is used as a variable attenuator and the second SPDT MMIC switch is used as a detector for the output power. By way of an electronic control circuit, the control of the output power to a defined level is achieved.

The use of the SPDT MMIC as a variable attenuator permits the adjustment of a desired transmission power and the compensation of chip spread. It forms the core component for a power control (control element). Because of the double function of the chip, the saving of costs will be considerable.

The use of the second SPDT MMIC as a power detector also results in a saving of costs because of the double function.

On the whole, the power control for the entire TR module results in an increase of the module yield by the compensation of chip spread and temperature effects. The multiple utilization of the SPDT MMICs as a switch, a variable attenuator and a power detector results in the above-mentioned advantages.

Details of the invention are indicated in the subclaims and in the description in which an embodiment is explained by means of the drawing.

DETAILED DESCRIPTION OF THE DRAWINGS

Figure 2:
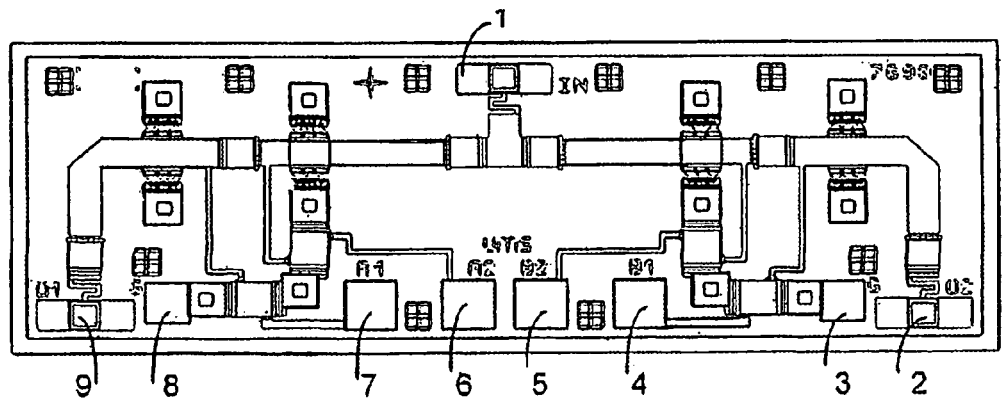
FIG. 2 is a view of the layout and the pad names of the known SPDT MMIC.
Figure 3:
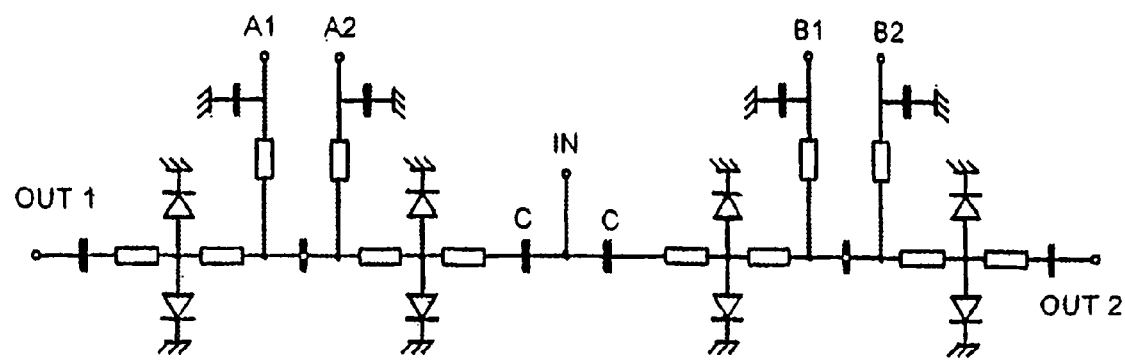
FIG. 3 is a circuit diagram.

According to the invention, the known MMIC can be operated either as a Schottky diode switch of the SPDT (single pole double throw) type or, by means of the selection of other supply voltages, as a variable attenuator. FIGS. 2 and 3 show the layout of the SPDT MMICs and a circuit diagram. In switch mode, the input power at the IN port is switched through either to port O1 or O2. For the operation as a variable attenuator, the O2 port is terminated in a reflectionless manner, and the IN-O2 switch arm is operated in the conducting direction. Between the IN and O1 ports, a variable attenuation between 3.5 and 25 dB can be adjusted by way of the DC supply voltage (see FIGS. 4 and 5).

Figure 4:
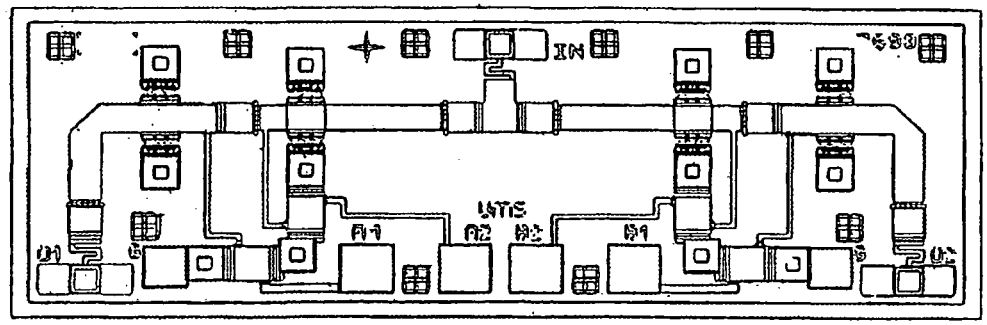
FIG. 4 is a view of the external wiring and the DC supply.

FIG. 4 is a view of the external wiring and the DC supply. The operating modes are the following:

Switch Mode:
IN-O1 switch arm in ON condition; IN-O2 switch arm in OFF condition:
  Pads A1, A2: −2.5V
  Pads B1, B2: 12 mA
OFF condition: Switch arm blocks
ON condition: Switch arm conducts The external voltage supply is applied to resistors of approximately 250 ohm in series with pads A1, A2, B1, B2.

Detector Operation:
IN-O1 Switch arm as a detector; IN-O2 switch arm in the OFF condition:
  Pads A1, A2: 0V, (1 kohm in series to pads)
  Pads B1, B2: 12 mA Operation as a Variable Attenuator:
IN-O1 switch arm in the ON condition (port O1 terminated with 50Ω); IN-O2 switch arm in the damping operation:
  Pads A1, A2: −2.5V
  Pads B1, B2: 0–12 mA (corresponds to 0–4V after series resistor 250 ohm)

Figure 6:
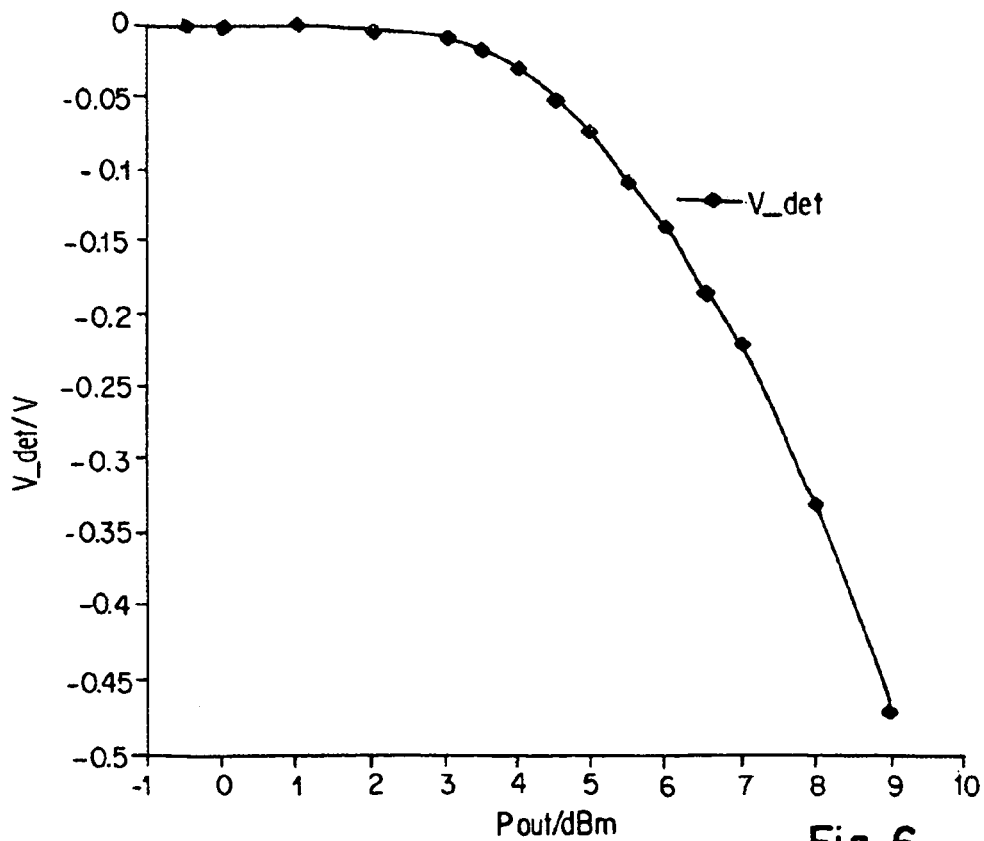
FIG. 6 is a graph of the use of the SPDT MMIC as the detector.

On the SPDT MMIC, two diode pairs 4/5 and 6/7, respectively, are connected on each switch arm between the HF line and the ground. During the operation of the SPDT MMICs as a power detector, one arm is blocked (for example, IN-O2); the second arm is switched to conduct by means of a bias voltage of 0V. The HF power flowing through the ON arm is rectified at the parallel connected diodes. The rectified voltage, which can be measured at pads A1 and A2 respectively, is a measure for the transmitted power, as illustrated in FIG. 6. The rectified voltage at the pad A2 is used for the power measurement. A power detection at the SPDT MMIC is possible for output power levels 3 dBm<P<10 dBm.

Figure 5:
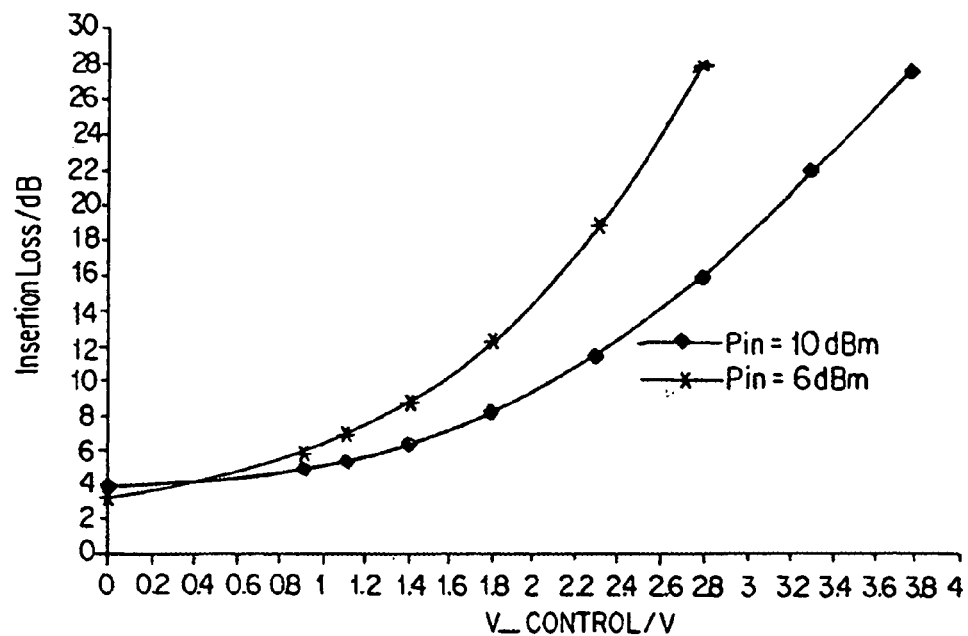
FIG. 5 is a graph of damping behavior as a function of the control voltage.

FIG. 5 illustrates the damping behavior as a function of the control voltage. The following values apply here:
DC Wiring and Voltage Supply:
Pads A1, A2: −2.5V
Pads B1, B2: Control voltage applied through 250 ohm series resistor.
RF Configuration:
Measurement at the wafer prober at 58 GHz
Input power at the IN port, output power at the O2 port; O1 port was terminated with a 10 dB attenuator.

FIG. 6 shows the use of the SPDT MMIC as a detector. In the diagram, the detector voltage is illustrated as a function of the measured output power. The following applies in this case:
DC Wiring and Voltage Supply:
Pads A1, A2: 0V applied through 1 kohm series resistor
Pads B1, B2: 12 mA
RF Configuration:
Measurement at the wafer prober at 58 GHz
Input power at the O1 port, output power at the IN port; O2 port was terminated with a 10 dB attenuator.

Figure 1:
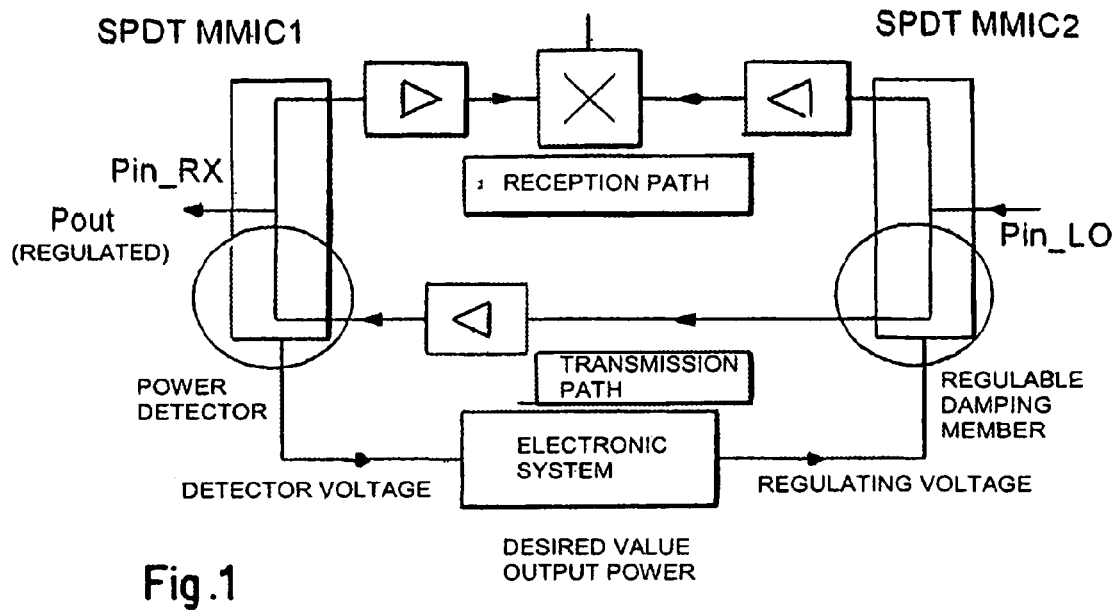
FIG. 1 is a block diagram of the transmitting power control according to the invention.
Figure 7:
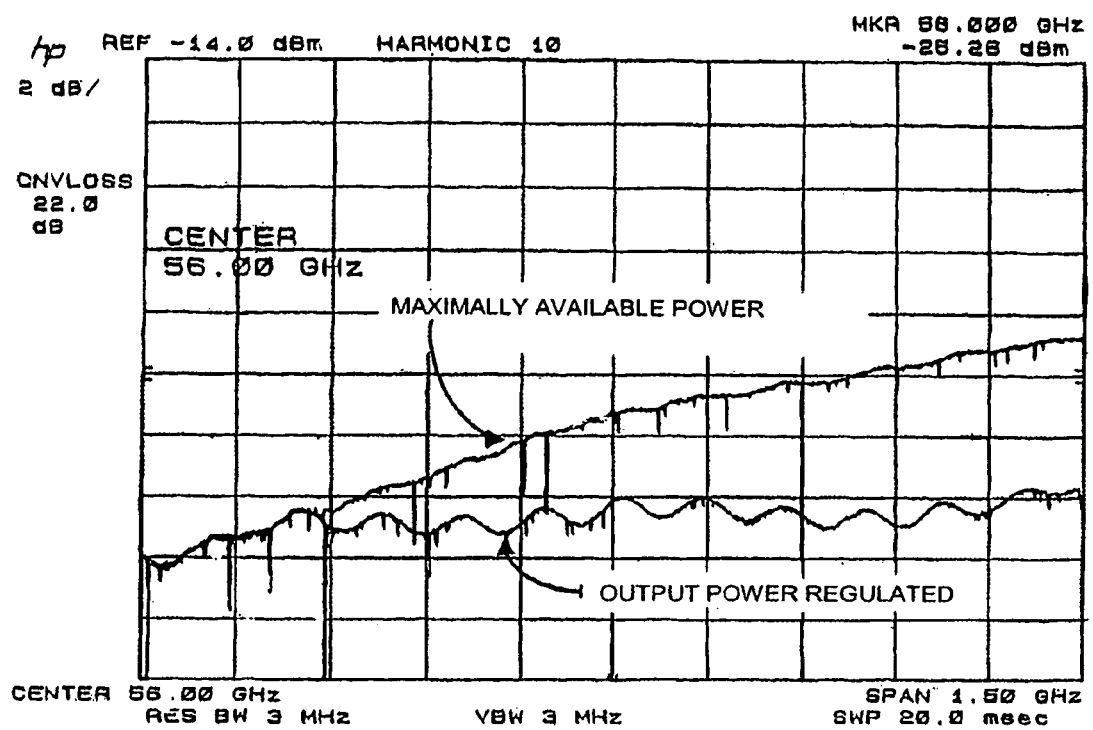
FIG. 7 is a graph of the maximally available and controlled transmitting power.

By means of the described components, the output power control for a transmit-receive module according to the invention was developed, as it is summarized in the block diagram of FIG. 1. In receive mode, both SPDT MMICs (1 and 2) are used as switches. The LO power (Pin LO) and the receive power (Pin RX) are switched to the mixer. In the case of a transmission, the SPDT MMIC 1 operates as a variable attenuator and the SPFT MMIC 2 operates as a power detector. The power control loop is closed by way of an analog electronic circuit. By way of the desired value at the electronic system, the desired output level is set. FIG. 7 shows the output power measured at the spectrum analyzer for the uncontrolled case (maximally available power) and the controlled case (Pout=5 dBm=const).

The invention claimed is:

1. Method to control the power of millimeter waves for a V-band TR module at a frequency in the range of 50 GHz and higher, the method comprising the acts of:
separating the transmitting and receiving path via two SPDT (single pole double throw) MMIC switches;
for the transmission, using the first SPDT MMIC switch as a variable attenuator and the second SPDT MMIC switch as a detector for the output power; and
by way of an electronic control circuit, the control of the output power to a defined level is achieved.

2. Device to control the power of millimeter waves for a V-band TR module at a frequency in the range of 50 GHz and higher, comprising:
two SPDT (single pole double throw) MMIC switches for separating the transmit and receive path;
wherein for transmission, the first SPDT MMIC switch is used as a variable attenuator and the second SPDT MMIC switch is used as a detector for the output power; and
an electronic unit to control the output power;
wherein in the case of the SPDT MMIC having two switch arms, on each switch arm, two parallel-connected diode pairs, respectively are connected between the RF line and ground, and wherein, in operation as a power detector, one arm is blocked and the second arm is switched via a bias voltage of 0 V to conducting, and further wherein the RF power flowing through the latter arm is rectified at the diodes, and the measurable rectified voltage is used as a measurement for the transmitted power.

3. Device to control the power of millimeter waves for a V-band TR module at a frequency in the range of 50 GHz and higher, comprising:
two SPDT (single pole double throw) MMIC switches for separating the transmit and receive path;
wherein for transmission, the first SPDT MMIC switch is used as a variable attenuator and the second SPDT MMIC switch is used as a detector for the output power; and
an electronic unit to control the output power;
wherein in the case of the SPDT MMIC having two switch arms, in switch mode, an input power at the IN port can optionally be switched to the O1 or O2 port, and wherein, in a mode as a variable attenuator, the O2 port is terminated in a reflection free manner and a variable attenuation can be set between the IN and O1 port by variation of the supply voltage.

* * * * *